United States Patent
Sugihara et al.

(10) Patent No.: US 9,438,377 B2
(45) Date of Patent: Sep. 6, 2016

(54) LLR COMPUTATION DEVICE AND ERROR CORRECTION DECODING DEVICE

(71) Applicants: Kenya Sugihara, Tokyo (JP); Wataru Matsumoto, Tokyo (JP)

(72) Inventors: Kenya Sugihara, Tokyo (JP); Wataru Matsumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 253 days.

(21) Appl. No.: 14/343,305

(22) PCT Filed: Oct. 5, 2012

(86) PCT No.: PCT/JP2012/075992
§ 371 (c)(1),
(2) Date: Mar. 6, 2014

(87) PCT Pub. No.: WO2013/080668
PCT Pub. Date: Jun. 6, 2013

(65) Prior Publication Data
US 2014/0229805 A1   Aug. 14, 2014

(30) Foreign Application Priority Data
Nov. 28, 2011   (JP) ................................. 2011-259068

(51) Int. Cl.
*H03M 13/00* (2006.01)
*H04L 1/00* (2006.01)
*H04L 25/06* (2006.01)
*H03M 13/11* (2006.01)
(Continued)

(52) U.S. Cl.
CPC .......... *H04L 1/0045* (2013.01); *H03M 13/612* (2013.01); *H03M 13/6337* (2013.01); *H04L 1/005* (2013.01); *H04L 1/0057* (2013.01); *H04L 25/067* (2013.01); *H03M 13/1102* (2013.01); *H04L 27/38* (2013.01); *H04L 2025/0342* (2013.01)

(58) Field of Classification Search
None
See application file for complete search history.

(56) References Cited

U.S. PATENT DOCUMENTS 7,796,700 B2 *   9/2010   Allpress ................ H04L 1/0052
375/144
8,059,763 B1   11/2011   Varnica et al.
(Continued)

FOREIGN PATENT DOCUMENTS

JP   2005-510177   4/2005
JP   2008-124843   5/2008
(Continued)

OTHER PUBLICATIONS

Partial Supplementary European Search Report issued Jun. 3, 2015 in Patent Application No. 12852846.0.
(Continued)

*Primary Examiner* — Justin R Knapp
(74) *Attorney, Agent, or Firm* — Oblon, McClelland, Maier & Neustadt, L.L.P.

(57) ABSTRACT

A two-reference-point-pair determining unit 101 determines two reference point pairs by selecting two transmission symbol points with their LLR computation target bit being 0 and two transmission symbol points with their LLR computation target bit being 1. An LLR computation unit 113 assigns weights to the two LLRs calculated for the two reference point pairs, respectively, followed by adding them, and further adds to the addition result a correction term that may be zero sometimes, thus computing LLR for the two reference point pairs.

20 Claims, 8 Drawing Sheets

(51) Int. Cl.
*H04L 27/38* (2006.01)
*H04L 25/03* (2006.01)

(56) References Cited

U.S. PATENT DOCUMENTS

| | | |
|---|---|---|
| 2003/0103585 A1 | 6/2003 | Kim et al. |
| 2006/0104378 A1* | 5/2006 | Allpress ............... H04L 1/0052 375/261 |
| 2011/0075770 A1 | 3/2011 | Seyama |

FOREIGN PATENT DOCUMENTS

| | | |
|---|---|---|
| JP | 2008-147764 | 6/2008 |
| JP | 2008-153874 A | 7/2008 |
| JP | 2009-055207 | 3/2009 |
| JP | 2011-77940 A | 4/2011 |

OTHER PUBLICATIONS

Extended European Search Report issued Jul. 24, 2015 in Patent Application No. 12852846.0.

Jin Whan Kang, et al., "A New LLR Approximation for BICM Systems with HARQ" IEICE Transactions on Communications, vol. E93B, No. 6, XP001557445, Jun. 2010, pp. 1628-1632.

Raman Yazdani, et al., "Efficient LLR Calculation for Non-Binary Modulations over Fading Channels" IEEE Transactions on Communications, vol. 59, No. 5, XP011322144, May 2011, pp. 1236-1241.

Reza Asvadi, et al., "Approximation of Log-Likelihood Ratio for Wireless Channels Based on Taylor Series" 2010 IEEE Global Telecommunications Conference, XP031846866, 2010, 5 Pages.

Filippo Tosato et al., "Simplified soft-output demapper for binary interleaved COFDM with application to HIPERLAN/2", 2002 IEEE International Conference on Communications, (2002. ICC), vol. 2, Sep. 2002, pp. 664-668.

Tadashi Wadayama, "A Coded Modulation Scheme Based on Low Density Parity Check Codes", IEICE transactions on fundamentals of electronics, communications and computer science, vol. E84-A, No. 10, Oct. 2001, pp. 2523-2527.

Reza Asvadi et al., "LLR Approximation for Wireless Channels Based on Taylor Series and Its Application to BICM with LDPC Codes", 2001 IEEE Global Telecommunications Conference (GLOBECOM 2011), Dec. 2011, pp. 1-6.

International Search Report issued Dec. 18, 2012, in PCT/JP2012/075992, filed Oct. 5, 2012.

* cited by examiner

Decoding Intermediate Result

LLR COMPUTATION DEVICE AND ERROR CORRECTION DECODING DEVICE

TECHNICAL FIELD

The present invention relates to an LLR computation device and an error correction decoding device using it, the LLR computation device calculating the bit Log-Likelihood Ratio (referred to as LLR from now on) representing reliability of transmission bits from the symbol coordinates of a received signal point received by a receiver of a communication system.

BACKGROUND ART

As shown in FIG. 1, to carry out soft-decision decoding of an error-correcting code such as a Low-Density Parity-Check (LDPC) code and turbo code from the symbol coordinates of received signal points a receiver of a communication system receives, an LLR computation device 100 calculates LLRs representing the reliability of transmission bits, and supplies the calculated bit LLRs to a soft-decision error correction decoder 110 that performs the error correction decoding and calculates an estimated bit string.

When a modulation scheme the communication system employs is a multivalued modulation scheme such as Phase Shift Keying (PSK), Amplitude Phase Shift Keying (APSK) and Quadrature amplitude modulation (QAM), each transmission symbol point comprises a plurality of bits. Designating the bit LLR of a kth bit among them by $L_k$, $L_k$ is calculated by the following Expression (1).

$$L_k = \ln \sum_{s_i \in C_{k,0}} \exp\left(-\frac{|r-s_i|^2}{2\sigma^2}\right) - \ln \sum_{s_i \in C_{k,1}} \exp\left(-\frac{|r-s_i|^2}{2\sigma^2}\right) \quad (1)$$

In Expression (1), r is the located vector (I coordinate, Q coordinate) of the received signal point, $s_i$ is the located vector of a transmission symbol point, $C_{k,0}$ is a set of all the transmission symbol points with the kth bit being 0, $C_{k,1}$ is a set of all the transmission symbol points with the kth bit being 1, and $\sigma$ is the standard deviation of Gaussian noise of a communication channel.

To calculate the bit LLR by Expression (1), it is necessary to calculate exponential functions exps, followed by adding the calculation results, and to calculate a logarithmic function ln of the sum, which results in enormous amount of computations. To implement the computations with a circuit is not practical from the viewpoint of a circuit scale.

In view of this, Non-Patent Document 1, for example, shows an approximation technique that leaves only a maximum value in the exps to be added in Expression (1) and neglects the others. Expression (2) shows the approximation method in the equation. In Expression (2), $s_{k, 0, min}$ is the located vector of a point closest to the received signal point r in the transmission symbol points with their kth bit being 0, and $s_{k, 1, min}$ is the vector of the point closest to the received signal point r in the transmission symbol points with their kth bit being 1.

$$L_k = \ln \sum_{s_i \in C_{k,0}} \exp\left(-\frac{|r-s_i|^2}{2\sigma^2}\right) - \quad (2)$$

$$\ln \sum_{s_i \in C_{k,1}} \exp\left(-\frac{|r-s_i|^2}{2\sigma^2}\right)$$

$$\approx \ln \max_{s_i \in C_{k,0}} \exp\left(-\frac{|r-s_i|^2}{2\sigma^2}\right) -$$

$$\ln \max_{s_i \in C_{k,1}} \exp\left(-\frac{|r-s_i|^2}{2\sigma^2}\right)$$

$$= \frac{-|r-s_{k,0,min}|^2 + |r-s_{k,1,min}|^2}{2\sigma^2} := L_{1,k}$$

The LLR computation technique according to Expression (2) of the Non-Patent Document 1 will be described using an example of 256 QAM, one of the multivalued modulation schemes, with reference to a drawing. As shown in FIG. 2, the 256 QAM is a multivalued modulation scheme which has symbols each consisting of 8 bits $a_1\ a_2\ a_3\ \ldots\ a_8$, and has 256 transmission symbol points. The LLR computation technique according to Expression (2) calculates transmission symbol points $s_{k, 0, min}$ and $s_{k, 1, min}$ from distances from the received signal point r as shown in FIG. 3, first. The two transmission symbol points are called reference points, and a pair of the reference points with their kth bits being 0 and 1 such as a pair of $s_{k, 0, min}$ and $s_{k, 1, min}$ is called a reference point pair. Next, as for each reference point of the reference point pair, the square of the distance between it and the received signal point r is calculated. After that, the square of the distance between $s_{k, 0, min}$ and r is subtracted from the square of the distance between $s_{k, 1, min}$ and r. Then the subtraction result is divided by $2\sigma^2$. The foregoing Expression (2) shows the computation. Actually, the computations are performed for each k to calculate an approximate value of the bit LLR for each of the eight bits constituting each symbol of the 256 QAM. The bit LLR of the kth bit calculated by the method of the Non-Patent Document 1 is designated as $L_{1, k}$ from now on.

In addition, Non-Patent Document 2 describes another bit LLR computation method. As shown in FIG. 4, in the configuration of the Non-Patent Document 2, an LLR computation device 200 receives feedback from an LDPC decoder 210 which is a post-stage of the LLR computation device 200. The LDPC decoder 210 carries out decoding of the LDPC code repeatedly using sum-product decoding, and feeds an intermediate decoding result (estimated bit string) obtained at each repeated stage back to the LLR computation device 200.

In the Non-Patent Document 2, the reference point pair is determined from the intermediate decoding result obtained by the configuration of FIG. 4. When designating the reference point pair by $s_{k, 0, dec}$ and $s_{k, 1, dec}$, the LLR is calculated by Expression (3) which is an approximation of Expression (1). Incidentally, $s_{k, 0, dec}$ represents a transmission symbol point that has kth bit of 0 and has the other bits equal to the intermediate decoding result, and $s_{k, 1, dec}$ represents a transmission symbol point that has kth bit of 1 and has the other bits equal to the intermediate decoding result. FIG. 5 shows an example. As is clear from the comparison of Expression (3) with Expression (2), the Non-Patent Document 1 and the Non-Patent Document 2 has the same LLR computation method except for the determining method of the reference point pair. In the following, the bit LLR of the kth bit calculated by the method of the Non-Patent Document 2 is designated by $L_{2, k}$.

$$L_k = \ln \sum_{s_i \in C_{k,0}} \exp\left(-\frac{|r-s_i|^2}{2\sigma^2}\right) - \qquad (3)$$

$$\ln \sum_{s_i \in C_{k,1}} \exp\left(-\frac{|r-s_i|^2}{2\sigma^2}\right)$$

$$\approx \ln\exp\left(-\frac{|r-s_{k,0,dec}|^2}{2\sigma^2}\right) -$$

$$\ln\exp\left(-\frac{|r-s_{k,1,dec}|^2}{2\sigma^2}\right)$$

$$= \frac{-|r-s_{k,0,dec}|^2 + |r-s_{k,1,dec}|^2}{2\sigma^2} := L_{2,k}$$

PRIOR ART DOCUMENT

Non-Patent Document

Non-Patent Document 1: F. Tosato and P. Bisaglia, "Simplified Soft-Output Demapper for Binary Interleaved COFDM with Application to HIPERLAN/2", in Proc. Int. Conf. Commun., September 2002, pp. 664-668.

Non-Patent Document 2: T. Wadayama, "A Coded Modulation Scheme Based on Low Density Parity Check Codes", IEICE transactions on fundamentals, vol. E84-A, no. 10, pp. 2523-2527, October 2001.

DISCLOSURE OF THE INVENTION

Problems to be Solved by the Invention

The conventional bit LLR computation methods designate two transmission symbol points serving as the reference points, and carry out approximation by neglecting the other transmission symbol points. The original ideal bit LLR computation expression includes all the transmission symbol points in the multivalued modulation scheme. Therefore, the conventional approximation methods that carry out the approximation by neglecting the transmission symbol points other than the two points have a problem of low approximation accuracy. As a result, they have another problem of deteriorating the decoding performance considerably of the soft-decision error correction decoder.

The present invention is implemented to solve the foregoing problems. Therefore it is an object of the present invention to provide an LLR computation device and an error correction decoding device capable of improving the approximation accuracy of the LLR calculated.

Means for Solving the Problems

An LLR computation device in accordance with the present invention is an LLR computation device of a receiver for receiving a signal that is generated by modulating an error-correcting-coded bit string by a multivalued modulation scheme and is transmitted to the receiver, the LLR computation device comprising: a reference-point-pair determining unit that determines two reference point pairs by selecting two transmission symbol points with their LLR (Log-Likelihood Ratio) computation target bit being 0 and two transmission symbol points with their LLR computation target bit being 1; and an LLR computation unit that assigns weights to two LLRs calculated for the two reference point pairs, respectively, followed by adding them, and that further adds to the addition result a correction term that may be zero sometimes, thereby computing an LLR for the two reference point pairs.

Advantages of the Invention

The LLR computation device in accordance with the present invention determines the two reference point pairs by selecting two transmission symbol points with their LLR computation target bit being 0 and two transmission symbol points with their LLR computation target bit being 1, assigns weights to two LLRs calculated for the two reference point pairs, respectively, followed by adding them, and further adds to the addition result the correction term that may be zero sometimes, thereby computing the LLR for the two reference point pairs. Accordingly, it can improve the approximation accuracy of the LLR calculated.

BEST MODE FOR CARRYING OUT THE INVENTION

The best mode for carrying out the invention will now be described with reference to the accompanying drawings to explain the present invention in more detail.

Embodiment 1

A transmitter of a communication system, which carries out communication using a multivalued modulation scheme and error-correcting code, modulates a transmission bit string coded in an error-correcting code in accordance with the multivalued modulation scheme and transmits it. A receiver carries out demodulation of the multivalued modulation scheme and decoding of the error-correcting code, thereby obtaining an estimated bit string as a result of the estimation of the transmission bit string.

Figure 1:
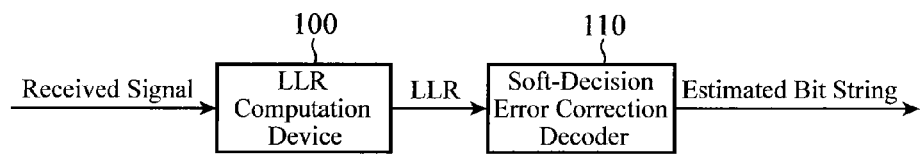
FIG. 1 is a block diagram showing a configuration of a receiver of a communication system.
Figure 2:
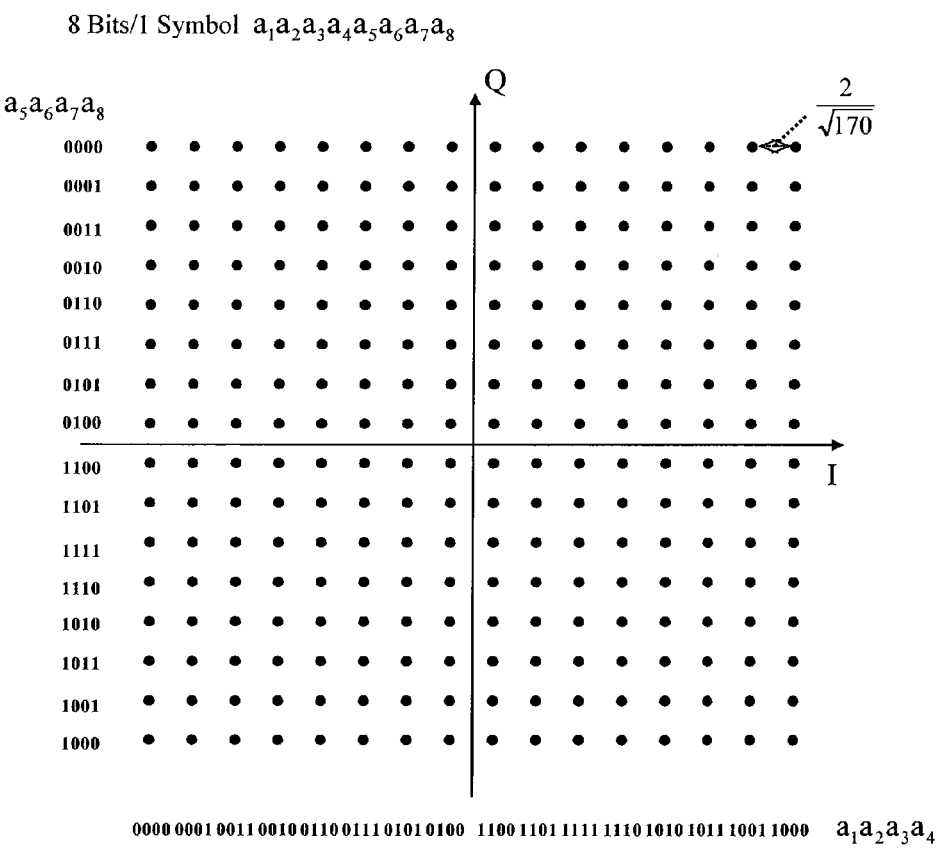
FIG. 2 is a diagram showing transmission symbol points in a multivalued modulation scheme.
Figure 3:
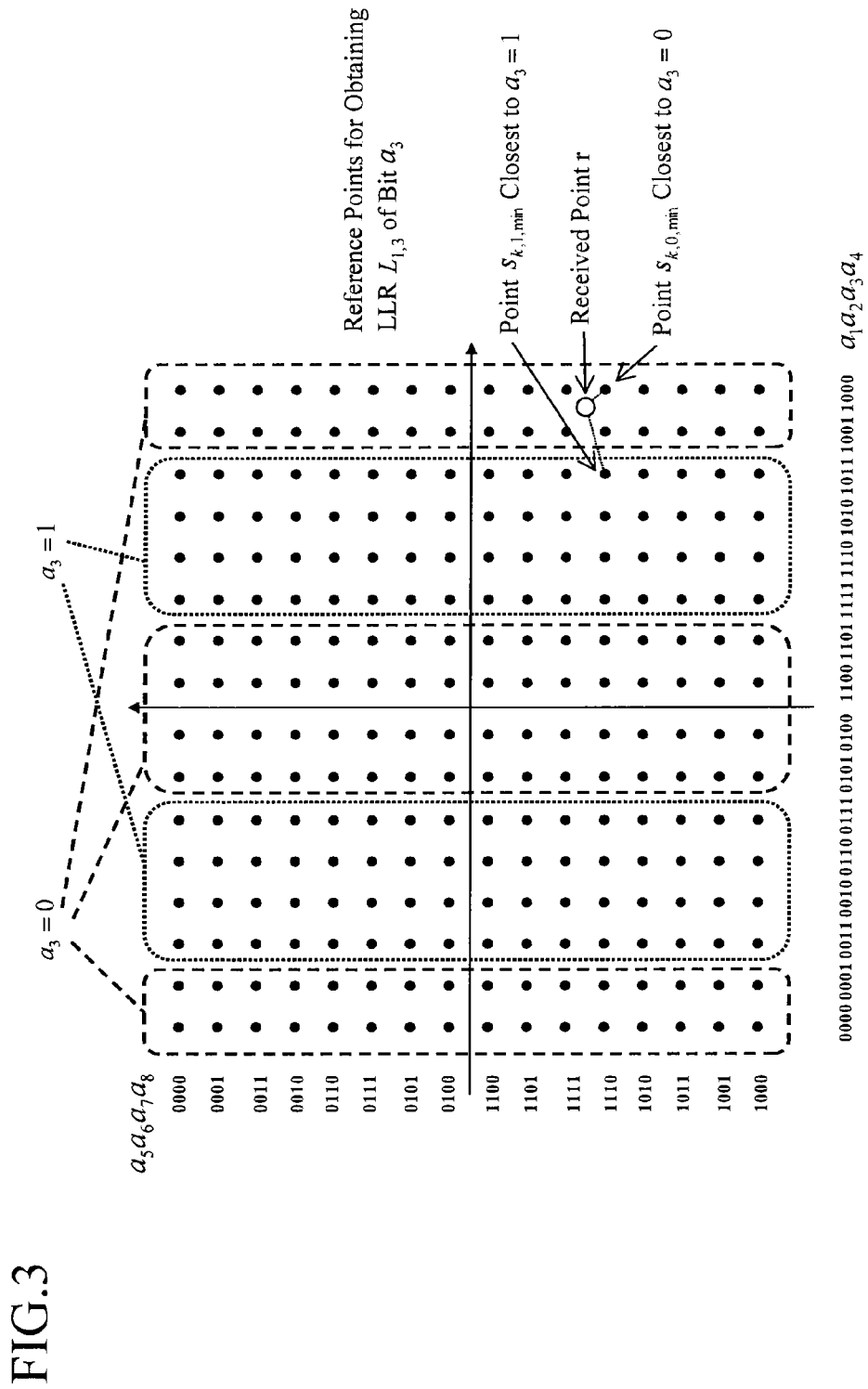
FIG. 3 is a diagram showing an LLR computation technique.
Figure 4:
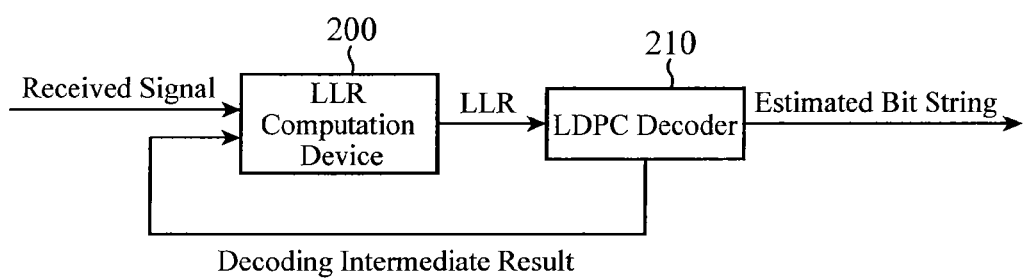
FIG. 4 is a block diagram showing another conventional LLR computation technique.
Figure 5:
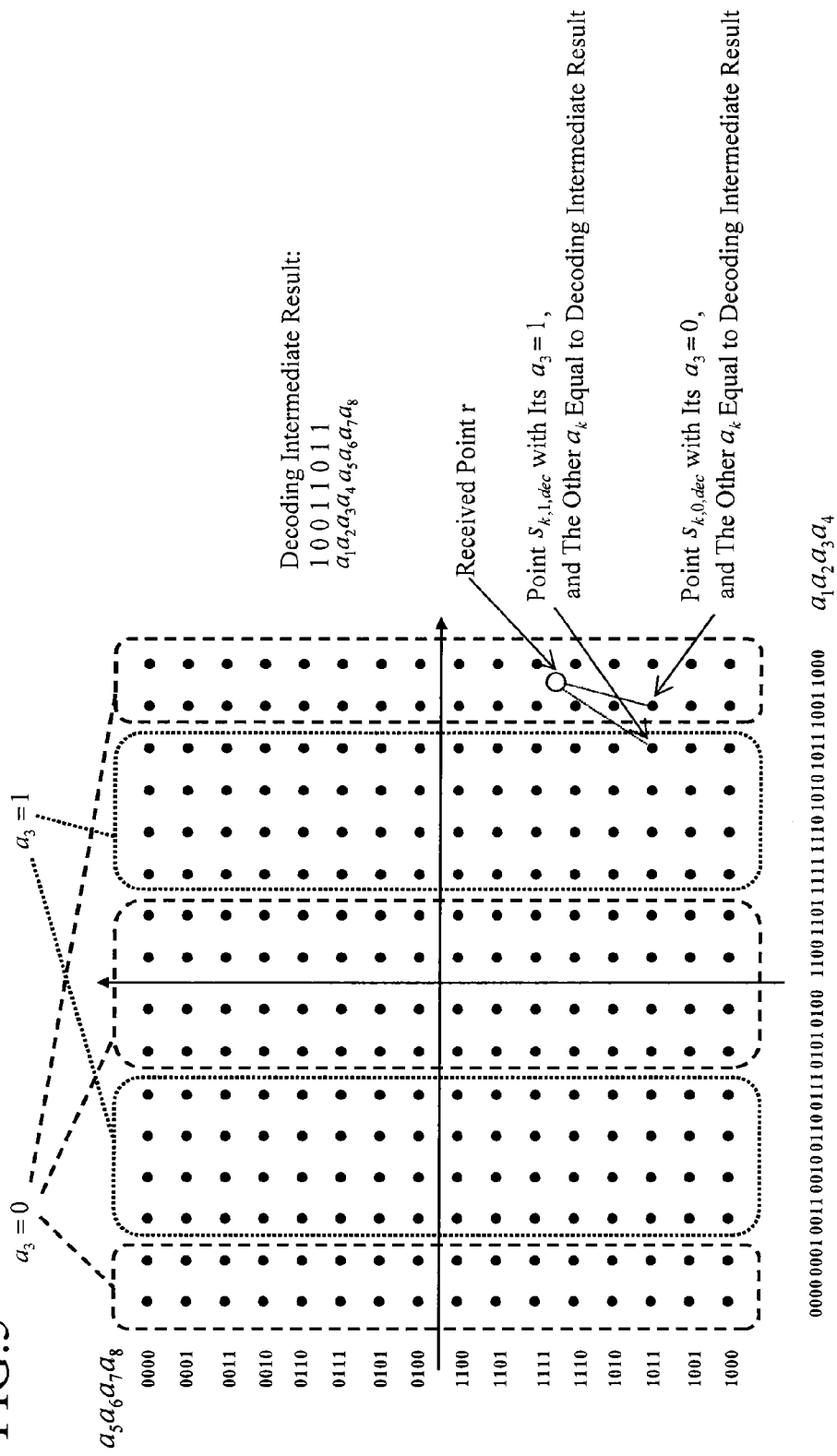
FIG. 5 is a diagram showing another conventional LLR computation technique.

The present invention is an invention relating to a receiver comprising the LLR computation device 100 and the soft-decision error correction decoder 110 as shown in FIG. 1.

In the embodiment 1, an LLR computation device that calculates the bit LLR using two reference point pairs (four reference points) will be described.

Before describing an internal configuration of the LLR computation device, derivation of an LLR computation expression that enables computation of the LLR using the two reference point pairs will be described.

First, deleting all the terms except for the exponential functions exps relating to the two reference point pairs to be used for the LLR computation from the original LLR computation Expression (1) without any approximation deterioration yields an approximate expression given by the following Expression (4).

$$L_k = \ln \sum_{s_i \in C_{k,0}} \exp\left(-\frac{|r - s_i|^2}{2\sigma^2}\right) - \ln \sum_{s_i \in C_{k,1}} \exp\left(-\frac{|r - s_i|^2}{2\sigma^2}\right) \quad (4)$$

$$\approx \ln\left(\exp\left(-\frac{|r - s_j|^2}{2\sigma^2}\right) + \exp\left(-\frac{|r - s_k|^2}{2\sigma^2}\right)\right) - \ln\left(\exp\left(-\frac{|r - s'_j|^2}{2\sigma^2}\right) + \exp\left(-\frac{|r - s'_k|^2}{2\sigma^2}\right)\right)$$

As for the exp terms to be deleted from Expression (1) in a derivation process of Expression (4) from Expression (1) or the two reference point pairs to be used for the LLR computation, they can be any terms, and selecting any two reference point pairs yields the same type of expression. In the following embodiments including the following approximation, a selecting method of the two reference point pairs to be used for the LLR computation is not limited. In addition, a concrete method of selecting the two reference point pairs will be described later as an example.

As for Expression (4), it is necessary to calculate a logarithm of the sum of the exponential functions exps, and its computation amount is large. Accordingly, the computation amount is reduced according to the following approximate expressions. The following Expression (5), Expression (6) and Expression (7) are equations describing an approximation technique to be applied to Expression (4). The left-hand side of Expression (5) represents variables of the exponential functions of Expression (4) by x and y, where x and y are not less than 0. The left-hand side of Expression (5) is transformed as shown in the lower line of the right-hand side, where min (x,y) is the minimum value of the x and y.

$$\ln(\exp(-x) + \exp(-y)) = \ln \exp(-\min(x, y)) \quad (5)$$
$$(1 + \exp(-|y - x|))$$
$$= -\min(x, y) + \ln(1 + \exp(-|y - x|))$$

$$\ln(1 + \exp(-t)) = \ln 2 - \frac{1}{2}t + \frac{1}{8}t^2 - \frac{1}{84}t^3 + \ldots \quad (6)$$
$$\approx \max\left(0, A - \frac{1}{2}t\right)$$

$$\ln(\exp(-x) + \exp(-y)) = \ln \exp(-\min(x, y)) \quad (7)$$
$$(1 + \exp(-|y - x|))$$
$$= -\min(x, y) + \ln(1 + \exp(-|y - x|))$$
$$\approx -\min(x, y) + \max\left(0, A - \frac{1}{2}|y - x|\right)$$

The term ln (1+exp(−|y−x|)) that appears after the transform of Expression (5) can be expressed by the Taylor expansion about 0 as shown in the first line of Expression (6). In the expression after the Taylor expansion, if t (≥0) is small, it is possible to ignore a third-order term and after because they are small enough. However, since only ignoring them will cause deterioration of the approximation accuracy, a constant term is added to correct the deterioration. In the second line of Expression (6), the term A represents the sum of the term ln 2 originally included in the first line of Expression (6) and the constant term added for the approximation correction. Incidentally, since the left-hand side of Expression (6) is not less than 0 regardless of the variable t, the right-hand side is set at max(0, A−t/2) to make it not less than 0. The term max (0, A−t/2) represents the maximum value of 0 and (A−t/2).

As an example of the constant A, A is set at A=0.9. In this case, the approximation deterioration is small. In addition, a more appropriate value A can be searched for and determined by computer simulation or real machine validation as to the LLR computation device and the soft-decision error correction decoder. Anyway the configuration does not limit the value A.

Applying Expression (6) to Expression (5), followed by transformation will yield Expression (7).

Applying Expression (7) to Expression (4) will yield Expression (8).

$$L_k = \ln \sum_{s_i \in C_{k,0}} \exp\left(-\frac{|r - s_i|^2}{2\sigma^2}\right) - \ln \sum_{s_i \in C_{k,1}} \exp\left(-\frac{|r - s_i|^2}{2\sigma^2}\right) \quad (8)$$

$$\approx \ln\left(\exp\left(-\frac{|r - s_j|^2}{2\sigma^2}\right) + \exp\left(-\frac{|r - s_l|^2}{2\sigma^2}\right)\right) -$$

$$\ln\left(\exp\left(-\frac{|r - s'_j|^2}{2\sigma^2}\right) + \exp\left(-\frac{|r - s'_l|^2}{2\sigma^2}\right)\right)$$

$$\approx \frac{-\min(|r - s_j|^2, |r - s_l|^2) + \min(|r - s'_j|^2, |r - s'_l|^2)}{2\sigma^2} +$$

$$\max\left(0, A - \frac{1}{4\sigma^2}||r - s_l|^2 - |r - s_j|^2|\right) -$$

$$\max\left(0, A - \frac{1}{4\sigma^2}||r - s'_l|^2 - |r - s'_j|^2|\right)$$

Figure 6:
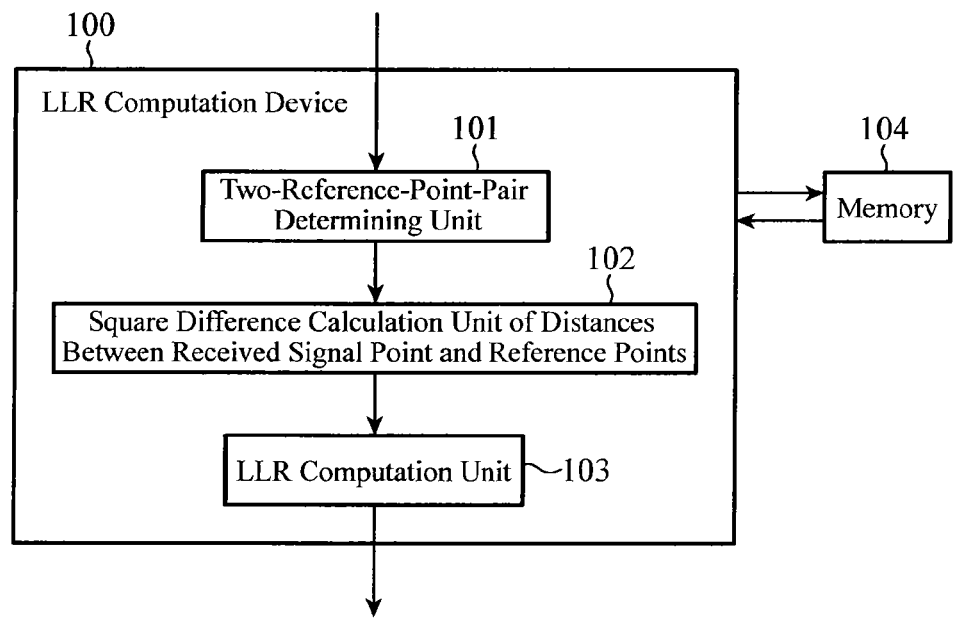
FIG. 6 is a block diagram showing a configuration of an LLR computation device of an embodiment 1 in accordance with the present invention.

Next, a configuration of a device that computes the LLR using Expression (8) will be described. As shown in FIG. 1, the LLR computation device 100 and the soft-decision error correction decoder 110 are incorporated into the receiver of the communication system. The configuration of the present embodiment is about the configuration of the LLR computation device 100. FIG. 6 shows the configuration. The configuration comprises a two-reference-point-pair determining unit 101, a square difference calculation unit 102 of distances between a received signal point and the reference points, an LLR computation unit 103, and a memory 104.

The two-reference-point-pair determining unit 101 selects two transmission symbol points with the LLR computation target bit being 0 and two transmission symbol points with the LLR computation target bit being 1, and determines the two reference point pairs. The square difference calculation unit 102 of the distances between the received signal point and the reference points calculates the square difference of the distances between the received signal point and the reference points. The LLR computation unit 103 computes the LLR using the preset LLR computation expression using as a reference the values calculated by the square difference calculation unit 102 of the distances between the received signal point and the reference points. The memory 104 stores intermediate computation values and calculation results occurring during the operations of the two-reference-point-pair determining unit 101, the square difference calculation unit 102 of the distances between the received signal point and the reference points and the LLR computation unit 103.

Next, the operation of the LLR computation device 100 of the embodiment 1 will be described.

The LLR computation device 100 receives the I-Q plane coordinates of the received signal point as its input. The two-reference-point-pair determining unit 101 determines the reference points $s_j$ and $s_l$ with the kth bit of the transmission symbol being 0, and the reference points $s'_j$ and $s'_l$ with the kth bit of the transmission symbol being 1. The two reference point pairs are determined for each kth bit. The object of the present invention is a communication system based on the multivalued modulation scheme in which the transmission symbol point consists of a plurality of bits as described before. Although the number of bits constituting a single symbol varies depending on the modulation scheme, the total number of the reference point pairs obtained by the two-reference-point-pair determining unit 101 is 2n, where n is the number of bits. Only, the reference points selected can overlap.

As for the reference points determined by the two-reference-point-pair determining unit 101, they can be any transmission symbol points, and the instant configuration can implement the determination regardless of the determining method. For example, it can select the transmission symbol points by considering the distances from the coordinates of the received signal point. As an example in this case, there is a method of selecting the closest and second closest points to the received signal point as $s_j$ and $s_l$ from among the transmission symbol points with the kth bit being 0, and selecting the closest and second closest points to the received signal point as $s'_j$ and $s'_l$ from among the transmission symbol points with the kth bit being 1. Such a selecting method can enable selecting important reference point pairs under any circumstances, and reducing the bit error rate of the estimated bits.

In addition, although FIG. 6 shows the configuration in which the two-reference-point-pair determining unit 101 receives as its input the received signal point input to the LLR computation device 100, a configuration is also possible which has no such input and determines the reference points independently of the received signal. For example, if a transmission symbol point that will be transmitted frequently is known in advance, a method is possible which selects the transmission symbol point as a reference point. In this way, if a transmission symbol point that will be transmitted frequently is known in advance, rather than select a transmission symbol point considering the distance from the coordinates of the received signal point, it can select more important reference point pairs. Anyway, the two-reference-point-pair determining unit 101 determines two reference point pairs for each bit constituting the transmission symbol point.

Next, the operation of the square difference calculation unit 102 of the distances between the received signal point and the reference points will be described. The calculation unit calculates the following two values to decide the min and max in Expression (8). First, it calculates the squares of the distances between the received signal point r and the two reference points $s_j$ and $s_l$ with their kth bit being 0, and obtains the difference between the squares. A concrete expression is given by Expression (9).

$$|r-s_l|^2 - |r-s_j|^2 \qquad (9)$$

Likewise, it calculates the squares of the distances between the received signal point r and the two reference points $s'_j$ and $s'_l$ with their kth bit being 1, and obtains the difference between the squares. At the same time, the calculation unit 102 decides the point closer to the received signal point r between the reference points $s_j$ and $s_l$ with their kth bit being 0, and further decides the point closer to the received signal point r between the reference points $s'_j$ and $s'_l$ with their kth bit being 1. It goes without saying that these decisions are made by calculating the square difference of the distances between the received signal point r and points $s_j$ and $s_l$ (or $s'_j$ and $s'_l$) as described above, and by checking the positive and negative of the calculation result. Incidentally, what the square difference calculation unit 102 of the distances between the received signal point and the reference points calculates is a value of the square difference of the distances, and it is not always necessary to calculate the squares of the distance, but to calculate the difference using an expression passing through equivalent transformation.

For example, Expression (9) which passes through the equivalent transformation results in the following Expression (10), where r (I) is the I coordinate of r and r (Q) is the Q coordinate thereof, which is applied to the I coordinate and Q coordinate of $s_j$ and $s_l$ in the same manner, and the resultant value can be calculated using Expression (10). On this occasion, since the terms relating to $s_j$ and $s_l$ in Expression (10) have the same values independently of the received signal point r, they can be obtained by desktop numerical calculations in advance, and be incorporated into the device, which leads to reduction of a circuit scale and computation amount.

$$\begin{aligned}|r-s_l|^2 - |r-s_j|^2 &= (r(I)-s_l(I))^2 + (r(Q)-s_l(Q))^2 - \\ & \quad (r(I)-s_j(I))^2 - (r(Q)-s_j(Q))^2 \\ &= 2r(I)(s_j(I)-s_l(I)) - 2r(Q)(s_j(Q)-s_l(Q)) + \\ & \quad \{(s_l(I))^2 + (s_l(Q))^2\} - \{(s_j(I))^2 + (s_j((Q))^2\}\end{aligned} \qquad (10)$$

Incidentally, although the foregoing description of the operation of the two-reference-point-pair determining unit 101 and the square difference calculation unit 102 of the distances between the received signal point and the reference points is made about the kth bit, these processing units carry out the same calculations on each of the n bits constituting the transmission symbol points.

Next, the operation of the LLR computation unit 103 will be described. The computation unit calculates the LLR according to Expression (8). First, it decides two mins in Expression (8) from the reference point closer to r between the points $s_j$ and $s_l$ calculated by the square difference calculation unit 102 of the distances between the received signal point and the reference points and from the reference point closer to r between the points $s'_j$ and $s'_l$. Each min selects the term including the transmission symbol point closer to the received signal point r. Furthermore, it calculates the two maxes of Expression (8) using the square difference of the distances between the received signal point r and the points $s_j$ and $s_l$ calculated by the square difference calculation unit 102 of the distances between the received signal point and the reference points, and using the square difference of the distances between the received signal point r and the points $s'_j$ and $s'_l$, respectively. Incidentally, as for the standard deviation σ of the Gaussian noise on the communication channel, it is possible to employ a value estimated by an estimation device prepared separately. However, since the estimate of σ is difficult, it is also possible to set to the LLR computation unit 103 a value determined in advance by an experiment, test or simulation to be used in Expression (8). Thus, the mins and maxes are calculated by the foregoing operation, followed by calculating the LLR according to Expression (8) by the four arithmetic operations. Incidentally, although the foregoing description is made about the kth bit, the LLR computation unit 103 carries out the foregoing calculation for all the bits constituting the transmission symbol point.

A memory 104 is used appropriately for storing intermediate computation values and calculation results produced during operations of the two-reference-point-pair determining unit 101, the square difference calculation unit 102 of the distances between the received signal point and the reference points, and the LLR computation unit 103.

Incidentally, although the foregoing description is made on the assumption that the reference point which is closer to r between the points $s_j$ and $s_l$ is unknown and the reference point which is closer to r between the points $s'_j$ and $s'_l$ is unknown, there are some cases where they are known in advance. This holds true when the two-reference-point-pair determining unit 101 employs the distance from the received signal point r as the determination standard of the reference point pairs. As an example, the transmission symbol point which is closest to the received signal point r and has the kth bit of 0 is employed as the reference point $s_j$, and the transmission symbol point which is closest to the received signal point r and has the kth bit of 1 is employed as the reference point $s'_j$. If the points $s_j$ and $s'_j$ are known that they are closest to the received signal point, Expression (8) can be reduced to Expression (11). In this case, the square difference calculation unit 102 of the distances between the received signal point and the reference points can omit among its operations the calculation of the reference points closer to the received signal point r, and further the LLR computation unit 103 can omit the decision of the two mins among its operations.

$$L_k = \ln \sum_{s_i \in C_{k,0}} \exp\left(-\frac{|r-s_i|^2}{2\sigma^2}\right) - \ln \sum_{s_i \in C_{k,1}} \exp\left(-\frac{|r-s_i|^2}{2\sigma^2}\right) \quad (11)$$

$$\approx \ln\left(\exp\left(-\frac{|r-s_j|^2}{2\sigma^2}\right) + \exp\left(-\frac{|r-s_l|^2}{2\sigma^2}\right)\right) -$$

$$\ln\left(\exp\left(-\frac{|r-s'_j|^2}{2\sigma^2}\right) + \exp\left(-\frac{|r-s'_l|^2}{2\sigma^2}\right)\right)$$

$$\approx \frac{-|r-s_j|^2, |r-s_l|^2}{2\sigma^2} +$$

$$\max\left(0, A - \frac{1}{4\sigma^2}(|r-s_l|^2 - |r-s_j|^2)\right) -$$

$$\max\left(0, A - \frac{1}{4\sigma^2}(|r-s'_l|^2 - |r-s'_j|^2)\right)$$

In this way, according to the embodiment 1, Expression (1) which is the ideal LLR computation expression can be approximated by the approximate expression using the two reference point pairs. This enables it to calculate the LLR at approximation accuracy higher than that when using a single reference point pair. In addition, the computation amount can be further reduced by calculating the LLR by Expression (8), a further approximation of Expression (4), which is a simple approximate expression for using the two reference point pairs. Furthermore, it is expected that the LLR calculated by the higher approximation accuracy can improve the decoding performance of the soft-decision error correction decoder.

As described above, according to the LLR computation device of the embodiment 1, which is an LLR computation device of a receiver for receiving the signal that is generated by modulating an error-correcting-coded bit string by a multivalued modulation scheme and is transmitted to the receiver, it comprises the reference-point-pair determining unit that determines the two reference point pairs by selecting two transmission symbol points with their LLR computation target bit being 0 and two transmission symbol points with their LLR computation target bit being 1; the square difference calculation unit that calculates the difference between the square of the distance between the received signal point and the first reference point with the same target bit and the square of the distance between the received signal point and the second reference point with the same target bit; and the LLR computation unit that computes the LLR according to the value calculated by the square difference calculation unit using the preset LLR computation expression. Accordingly, it can improve the approximation accuracy of the LLR calculated.

In addition, according to the LLR computation device of the embodiment 1, because the LLR computation unit calculates the LLR using Expression (8), it can achieve both the improvement of the approximation accuracy of the LLR and the reduction of the computation amount.

In addition, according to the LLR computation device of the embodiment 1, because the reference-point-pair determining unit determines all or part of the reference point pairs from the transmission symbol point closest to the received signal point in the distance, it can achieve both the improvement of the approximation accuracy of the LLR and the reduction of its computation amount.

In addition, according to the LLR computation device of the embodiment 1, because it determines a transmission symbol that is known in advance to be frequently or always transmitted as all or part of the reference points, it can achieve both the improvement of the approximation accuracy of the LLR and the reduction of its computation amount.

Embodiment 2

The embodiment 2 is an example that tries to reduce the computation amount by applying further approximation to the LLR computation Expression (8) used in the embodiment 1.

As for the two maxes in Expression (8), whether 0 or the other term (the term including σ, constant A, and the square difference of the distances) is selected has much to do not only with the square difference of the distances between the received signal point and the reference points and the constant A, but also with the standard deviation σ of the Gaussian noise. When the standard deviation σ is very large, an error can occur which cannot be corrected by the error correction decoder because of too large noise. In addition, when the standard deviation σ is very small, the noise is small and its effect on the error correction capability of the error correction decoder due to the difference of the LLR calculation method is small, and almost all the errors can be corrected. Thus, the magnitude of the standard deviation the communication system takes as a matter is their intermediate level, and at such standard deviation σ, there is little possibility that 0 is selected in the two maxes of Expression (8). Accordingly, neglecting the case where 0 is selected in the maxes of Expression (8) and calculating the LLR by Expression (12) that replaces the maxes by the term other than 0 in the maxes will give only minor approximation deterioration from Expression (8). In practice, decoding performance evaluation combined with the soft-decision error correction decoder shows only little difference between Expression (8) and Expression (12).

$$L_k \approx \frac{-\min(|r-s_j|^2, |r-s_l|^2) + \min(|r-s'_j|^2, |r-s'_l|^2)}{2\sigma^2} + \quad (12)$$

$$\max\left(0, A - \frac{1}{4\sigma^2}(|r-s_l|^2 - |r-s_j|^2)\right) -$$

$$\max\left(0, A - \frac{1}{4\sigma^2}(|r-s'_l|^2 - |r-s'_j|^2)\right)$$

$$\approx \frac{-\min(|r-s_j|^2, |r-s_l|^2) + \min(|r-s'_j|^2, |r-s'_l|^2)}{2\sigma^2} +$$

$$\left(A - \frac{1}{4\sigma^2}||r-s_l|^2 - |r-s_j|^2|\right) -$$

$$\left(A - \frac{1}{4\sigma^2}||r-s'_l|^2 - |r-s'_j|^2|\right)$$

$$= \frac{1}{2}\left(\frac{-|r-s_j|^2 + |r-s'_j|^2}{2\sigma^2} + \frac{-|r-s_l|^2 + |r-s'_l|^2}{2\sigma^2}\right)$$

Incidentally, regardless of the term which is selected in each of the two mins in Expression (12), the expression of the bottom line is given. This can be easily confirmed by transforming the foregoing Expression for each of the four cases the two mins can select.

In addition, since Expression (12) includes not only the deterioration due to approximation of Expression (8), but also approximation deterioration due to the approximation of Expression (1) to Expression (8), it is not unlikely that the approximation accuracy reduces in some cases. In such a case, the approximation accuracy can be improved by introducing w and B as shown in Expression (13) to make correction. As for the values of w and B, they can be searched for and determined by computer simulation, and B can be set at B=0 to make correction by using only w. Expression (13) is reduced to Expression (12) by placing w=½ and B=0. Here, w and (1−w) correspond to weighting values, and w=½ corresponds to equal weighting. In addition, B corresponds to a correction term that can be zero sometimes, which shows that B may not be added (B=0 is possible).

$$L_k \approx w\left(\frac{-|r-s_j|^2 + |r-s'_j|^2}{2\sigma^2}\right) + (1-w)\left(\frac{-|r-s_l|^2 + |r-s'_l|^2}{2\sigma^2}\right) + B \quad (13)$$

Figure 7:
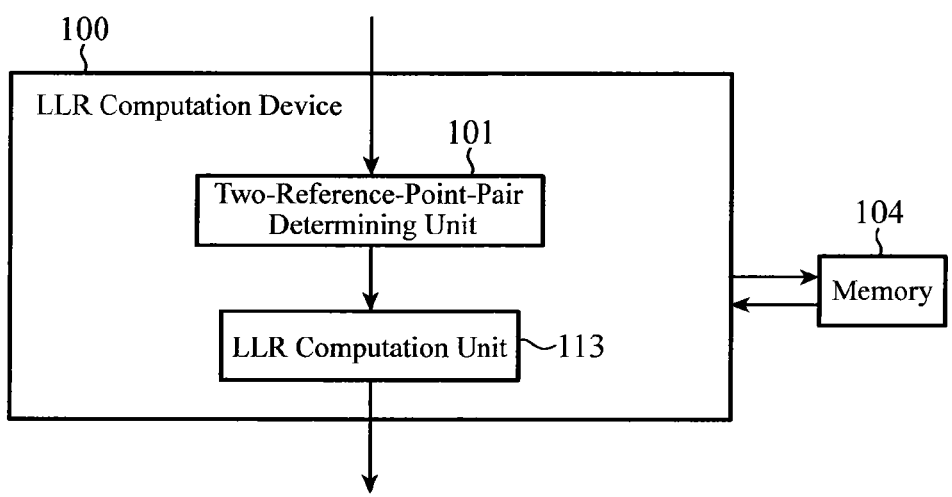
FIG. 7 is a block diagram showing a configuration of an LLR computation device of an embodiment 2 in accordance with the present invention.

The present embodiment shows a configuration of the LLR computation device using the bottom line of Expression (12) and Expression (13) for the LLR computation. FIG. 7 is a block diagram showing a configuration of the present embodiment. The configuration shown in FIG. 7 is a configuration of the LLR computation device 100 which comprises the two-reference-point-pair determining unit 101, an LLR computation unit 113, and the memory 104. More specifically, the two-reference-point-pair determining unit 101 determines two reference point pairs by selecting two transmission symbol points with their LLR computation target bit being 0 and two transmission symbol points with their LLR computation target bit being 1 in the same manner as the two-reference-point-pair determining unit 101 of the embodiment 1. In addition, the LLR computation unit 113 assigns weights to and adds the two LLRs calculated for the two reference point pairs, respectively, and computes as the LLR for the two reference point pairs a value by further adding to the addition result the correction term that can be zero sometimes. As in the embodiment 1, the memory 104 is appropriately used for storing intermediate computation values and calculation results that can occur during the operations of the two-reference-point-pair determining unit 101 and the LLR computation unit 113.

Next, the operation of the LLR computation device of the embodiment 2 will be described.

The two-reference-point-pair determining unit 101 determines the two reference point pairs to be used for the LLR computation. It is assumed in the embodiment 2 that it operates in the same manner as the two-reference-point-pair determining unit 101 in the embodiment 1. In addition, as in the embodiment 1, the reference points determined by the two-reference-point-pair determining unit 101 can be any transmission symbol points, and the present configuration can be implemented regardless of the method of determining them.

The LLR computation unit 113 calculates the LLR using the two reference point pairs determined by the two-reference-point-pair determining unit 101 according to Expression (12) or Expression (13). At the calculation, it is possible to calculate using an expression obtained by applying equivalent transformation to Expression (12) or Expression (13) to reduce the computation amount. In addition, the calculation can be made using a lookup table.

According to the foregoing configuration, it approximates Expression (1) which is the ideal LLR computation expression by the approximate expression using the two reference point pairs, thereby being able to calculate the LLR at approximation accuracy higher than when using a single reference point pair. In addition, since it calculates the LLR using Expression (12) or Expression (13), an approximation of Expression (8) which is an approximate expression of the embodiment 1, it can reduce the computation amount. Furthermore, since it calculates the LLR by the approximate expression with the higher approximation accuracy using the two reference point pairs, it can improve the decoding performance of the soft-decision error correction decoder.

As described above, according to the LLR computation device of the embodiment 2, which is an LLR computation device of a receiver for receiving the signal that is generated by modulating an error-correcting-coded bit string by a multivalued modulation scheme and is transmitted to the receiver, it comprises the reference-point-pair determining unit that determines the two reference point pairs by selecting two transmission symbol points with their LLR computation target bit being 0 and two transmission symbol points with their LLR computation target bit being 1; and the LLR computation unit that assigns weights to and adds the two LLRs calculated for the two reference point pairs, respectively, and computes as the LLR for the two reference point pairs a value by further adding to the addition result the correction term that can be zero sometimes. Accordingly, it can achieve both the improvement of the approximation accuracy of the LLR and the reduction of the computation amount.

In addition, according to the LLR computation device of the embodiment 2, the LLR computation unit is configured in such a manner as to assign equal weights to the two LLRs. Thus, it can achieve both the improvement of the approximation accuracy of the LLR and the reduction of the computation amount.

Embodiment 3

Figure 8:
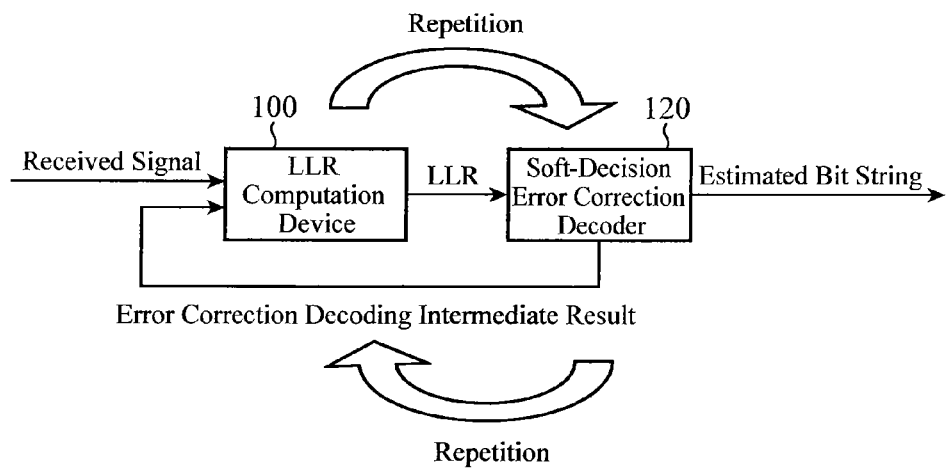
FIG. 8 is a block diagram showing a configuration of an error correction decoding device of an embodiment 3 in accordance with the present invention.

Although the embodiments 1 and 2 described above are configured in such a manner as to calculate the LLR using the two reference point pairs, the embodiment 3 describes a concrete determining method of the reference point pairs. FIG. 8 shows a configuration of the embodiment 3. The configuration of FIG. 8 shows an error correction decoding device comprising the LLR computation device 100 and a soft-decision error correction decoder 120. It differs from the embodiment 1 or 2 in that it is configured in such a manner as to feed an intermediate decoding result back to the LLR computation device 100 from the soft-decision error correction decoder 120.

The embodiment 3 will now be described in more detail. The LLR computation device 100 determines the reference points in the same manner as the embodiment 1 and embodiment 2, and calculates the LLR using the two reference point pairs.

The soft-decision error correction decoder 120 receives the LLR calculated by the LLR computation device 100, carries out soft-decision decoding, and outputs an estimated bit string. In addition, it feeds an intermediate decoding result which will be described later back to the LLR computation device 100.

In the embodiment 3, the LLR computation device 100 and the soft-decision error correction decoder 120 operate alternately to carry out repeated decoding. At the point when the LLR computation device 100 first receives the received signal, since it has no information fed back from the soft-decision error correction decoder, it operates in the same manner as in the embodiment 1 or embodiment 2. Next, the soft-decision error correction decoder 120 feeds the intermediate decoding result obtained by the soft-decision error correction decoding back to the LLR computation device 100. Receiving the intermediate decoding result, the LLR computation device 100 uses the feedback information about the intermediate decoding result to determine the two reference point pairs, and calculates the LLR using the two reference point pairs. Repeating the foregoing operation by a prescribed number of times, the soft-decision error correction decoder 120 outputs the estimated bit string.

Here, the error-correcting code implemented in the soft-decision error correction decoder 120 can be any error-correcting code as long as it can make soft-decision decoding. As an example of such a code, there is an LDPC code, turbo code, convolutional code, Reed-Solomon code, and BCH code. Incidentally, almost all the linear block codes and convolutional codes that are known at present can perform the soft-decision decoding theoretically.

As for the intermediate decoding result the soft-decision error correction decoder 120 feeds back, it may be an intermediate result in the repeated decoding of the LDPC code or turbo code, or a result of decoding of the BCH code or the like. The term "intermediate" in the intermediate decoding result refers to an "intermediate" stage in the repeated operation of the LLR computation device 100 and the soft-decision error correction decoder 120 until arriving at the prescribed number of times in the instant configuration, but does not refer to an intermediate stage in the operation of the soft-decision error correction decoder 120 alone.

As for the information fed back as the intermediate decoding result, it can be a bit sequence of a decoding result of the soft-decision error correction decoder 120, or can be probability information calculated from the input LLR. As a concrete example of the probability information, the LLR obtained as a result of the soft-decision decoding (referred to as a "posterior value" in this field) or a prior value obtained by subtracting the input LLR from the posterior value can be conceived.

In this way, using the information on the intermediate decoding result obtained by correcting part or all of the bit errors by the soft-decision error correction decoder 120, the embodiment 3 can determine the reference points. Accordingly, as compared with the case of determining the reference points only from the received signal point, it can select and determine the more important reference points (reference points closer to the bit string transmitted by the transmitter). As a result, it can improve the approximation accuracy of the LLR calculated, and can finally reduce the bit error rate of the estimated bits which is the error correction decoding result output from the error correction decoding device of the present configuration.

Figure 9:
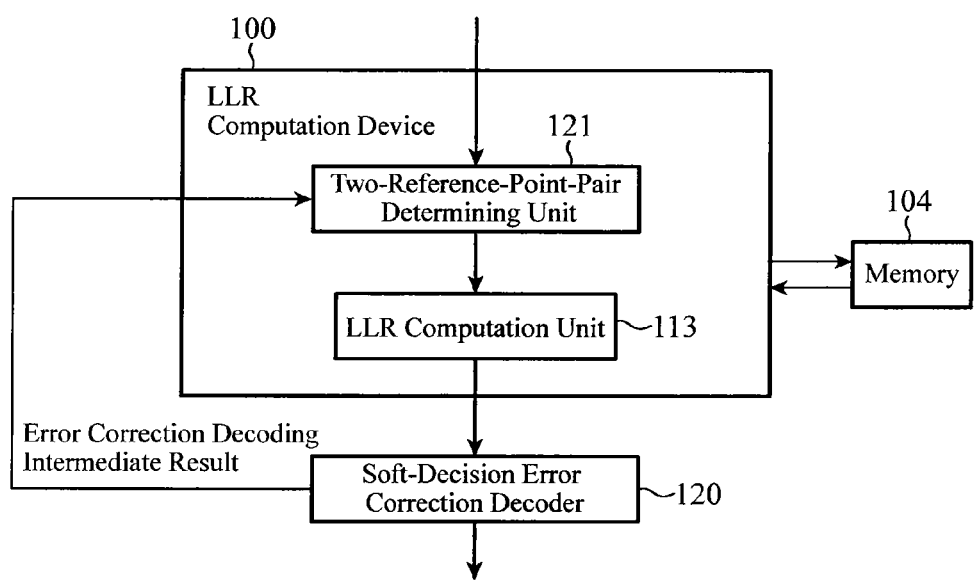
FIG. 9 is a block diagram showing an internal configuration of an LLR computation device of the error correction decoding device of the embodiment 3 in accordance with the present invention.

Next, as an example of the error correction decoding device of the embodiment 3, an internal configuration of the LLR computation device 100 is shown in FIG. 9. The LLR computation device 100 shown in FIG. 9 comprises a two-reference-point-pair determining unit 121, the LLR computation unit 113, and the memory 104. In addition, it is configured in such a manner as to feed the intermediate decoding result back to the two-reference-point-pair determining unit 121 from the soft-decision error correction decoder 120. As for the intermediate decoding result fed back in the configuration, it can be a bit string obtained as a decoding result of the soft-decision error correction decoder 120, or when decoding the LDPC code or turbo code by the repeated calculations, it can be a bit string obtained when the number of times of the repeated calculations in the soft-decision error correction decoder 120 reaches a prescribed number of times. It goes without saying that the decoding result obtained by carrying out the repeated calculations only once is also allowed.

Next, the operation of the error correction decoding device shown in FIG. 9 will be described.

The two-reference-point-pair determining unit 121 decides one or two reference point pairs from the intermediate decoding result fed back from the soft-decision error correction decoder 120 (when a single pair is determined from the fed back result, another pair is determined by another method to form two reference point pairs in total). For example, it decides a reference point pair by the method of the Non-Patent Document 1 and another reference point pair by the method of the Non-Patent Document 2 using the feedback, and employs them as the two reference point pairs. In this case, a calculation expression of the kth bit LLR $L_k$ in the LLR computation unit 113 can be given by the following Expression (14) using $L_{i,k}$ and $L_{2,k}$ as described in the BACKGROUND ART. In Expression (14), w and B are introduced to correct the approximation deterioration as in Expression (13). Placing them at w=½ and B=0 results in the LLR computation expression of the present embodiment corresponding to Expression (12).

$$L_k \approx wL_{1,k} + (1-w)L_{2,k} + B \tag{14}$$

It goes without saying that the error correction decoding device can be configured so as to use two reference point pairs determined by other methods. For example, it can select and determine the reference point pairs from a neighborhood of the transmission symbol point corresponding to the intermediate decoding result. In addition, on the assumption that the soft-decision error correction decoder 120 feeds back the probability information of the individual bits as an intermediate decoding result, it can calculates the transmission probability for each transmission symbol point from the probability information, and can select the reference points in descending order of the probability of the transmission symbol points.

Although the LLR computation unit 113 operates in the same manner as the LLR computation unit 113 of the embodiment 2 (FIG. 7), it calculates the LLR according to Expression (14) for the two reference point pairs mentioned as an example in the two-reference-point-pair determining unit 121.

The embodiment 3 differs from the embodiment 1 or 2 in that it repeats the calculation of the LLR any number of times on the basis of the feedback. In the middle of the repetition, w and B of Expression (13) and Expression (14) can be varied so as to use different values depending on the number of times of the repetition, which enables improving the approximation accuracy. Incidentally, the memory 104 operates in the same manner as in the embodiment 1 or 2.

According to the configuration, it can decide the reference points from the bit string with its error being corrected entirely or partly by the soft-decision error correction decoder 120 or from the probability information. This enables selecting and determining more important reference points (reference points closer to the bit string transmitted by the transmitter) as compared with the case of determining the reference points only from the received signal point. As a result, it can improve the approximation accuracy of the LLR calculated, and reduce the bit error rate of the estimated bits which are the error correction decoding result finally output from the error correction decoding device with the present configuration.

Figure 10:
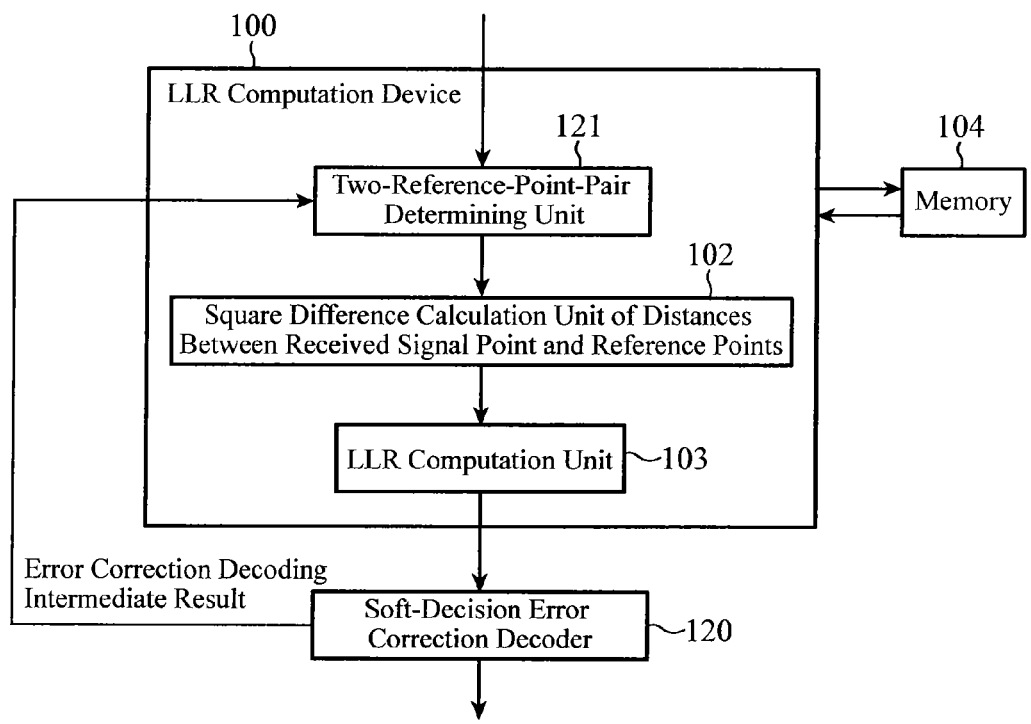
FIG. 10 is a block diagram showing an internal configuration of the LLR computation device of the error correction decoding device of the embodiment 3 in accordance with the present invention.

The configuration of the LLR computation device 100 of the embodiment 3 is not limited to that of FIG. 9. FIG. 10 shows a configuration other than that of FIG. 9.

The LLR computation device 100 with the configuration of FIG. 10 comprises the two-reference-point-pair determining unit 121, the square difference calculation unit 102 of the distances between the received signal point and the reference points, the LLR computation unit 103, and the memory 104. The feedback configuration is the same as that of FIG. 9.

The operation of the error correction decoding device shown in FIG. 10 is as follows.

The two-reference-point-pair determining unit 121 operates in the same manner as the two-reference-point-pair determining unit 121 in FIG. 9. In addition, the square difference calculation unit 102 of the distances between the received signal point and the reference points operates in the same manner as the square difference calculation unit 102 of the distances between the received signal point and the reference points of the embodiment 1 (see FIG. 6). Furthermore, the operation of the LLR computation unit 103 is the same as that of the LLR computation unit 103 in the embodiment 1 (FIG. 6). In addition, the memory 104 operates in the same manner as that of the embodiment 1.

The error correction decoding device shown in FIG. 10 offers the same advantage as the error correction decoding device shown in FIG. 9. In addition, it can calculate the LLR with the higher approximation accuracy than the configuration of FIG. 9 by calculating the LLR according to Expression (8) with higher approximation accuracy.

As described above, according to the error correction decoding device of the embodiment 3, it is configured in such a manner that it comprises the LLR computation device of the embodiment 1 or 2, and the soft-decision error correction decoder that performs error correction decoding based on the LLR computation result fed from the LLR computation device, in which the LLR computation device decides at least part of the reference point pairs from the intermediate decoding result of the error correction in the soft-decision error correction decoder. Accordingly, it can reduce the bit error rate of the estimated bits.

In addition, according to the error correction decoding device of the embodiment 3, since it is configured in such a manner as to output the final decoding result from the soft-decision error correction decoder after repeating the operation a prescribed number of times, it can output the error correction decoding result with a low bit error rate of the estimated bits.

Embodiment 4

In the foregoing embodiments, a configuration is described that calculates the LLR from the two reference point pairs. The reference point pairs, however, may be three or more pairs, and such an example will be described next as the embodiment 4.

First, deleting all the terms except for the exponential functions exps relating to the three reference point pairs to be used for the LLR computation from the original LLR computation Expression (1) without any approximation deterioration yields an approximate expression given by Expression (15).

$$L_k = \ln \sum_{s_i \in C_{k,0}} \exp\left(-\frac{|r-s_i|^2}{2\sigma^2}\right) - \ln \sum_{s_i \in C_{k,1}} \exp\left(-\frac{|r-s_i|^2}{2\sigma^2}\right) \tag{15}$$

$$\approx \ln\left(\exp\left(-\frac{|r-s_j|^2}{2\sigma^2}\right) + \exp\left(-\frac{|r-s_l|^2}{2\sigma^2}\right) + \exp\left(-\frac{|r-s_h|^2}{2\sigma^2}\right)\right) -$$

$$\ln\left(\exp\left(-\frac{|r-s'_j|^2}{2\sigma^2}\right) + \exp\left(-\frac{|r-s'_l|^2}{2\sigma^2}\right) + \exp\left(-\frac{|r-s'_h|^2}{2\sigma^2}\right)\right)$$

As for the exp terms to be deleted from Expression (1) in a derivation process of Expression (15) from Expression (1) or the three reference point pairs to be used for the LLR computation, they can be any terms, and selecting any three reference point pairs will yield the same type of expression. In the present embodiment including the following approximation, a selecting method of the three reference point pairs to be used for the LLR computation is not limited. In addition, a concrete method of selecting the three reference point pairs will be described by way of example. Expression (15) is further approximated. Expression (16) is obtained by denoting variables of exps of Expression (15) by x, y, z (x≥0, y≥0, z≥0), and by approximation using Expression (5) and Expression (6), in which x is assumed to be x=min (x, y, z). In addition, approximation similar to that applied to Expression (12) of the embodiment 2 is carried out, assuming that the nonzero term in the max of Expression (6) is to be selected.

$$\ln(e^{-x} + e^{-y} + e^{-z}) = \ln e^{-x}(1 + e^{-x}(e^{-y} + e^{-z})) \qquad (16)$$

$$= -x + \ln(1 + e^{x-y}(1 + e^{y-z}))$$

$$= -x + \ln\left(1 + e^{x-y+\ln(1+e^{y-z})}\right)$$

$$\approx -x + A - \frac{1}{2}\{-x + y - \ln(1 + e^{y-z})\}$$

$$= -\frac{1}{2}x - \frac{1}{2}y + A + \frac{1}{2}(\ln(1 + e^{y-z}))$$

$$\approx -\frac{1}{2}x - \frac{1}{2}y + A + \frac{1}{2}\left(A - \frac{1}{2}(z-y)\right)$$

$$= -\frac{1}{2}x - \frac{1}{4}y - \frac{1}{4}z + \frac{3}{2}A$$

Approximation of Expression (15) using Expression (16) yields Expression (17), where the transmission symbol point closest to the received signal point among $s_j$, $s_l$ and $s_h$ is assumed to be $s_j$, and likewise the transmission symbol point closest to the received signal point among $s'_j$, $s'_l$ and $s'_h$ is assumed to be $s'_j$.

$$L_k = \ln \sum_{s_i \in C_{k,0}} \exp\left(-\frac{|r-s_i|^2}{2\sigma^2}\right) - \ln \sum_{s_i \in C_{k,1}} \exp\left(-\frac{|r-s_i|^2}{2\sigma^2}\right) \qquad (17)$$

$$\approx \ln\left(\exp\left(-\frac{|r-s_j|^2}{2\sigma^2}\right) + \exp\left(-\frac{|r-s_l|^2}{2\sigma^2}\right) + \exp\left(-\frac{|r-s_h|^2}{2\sigma^2}\right)\right) -$$

$$\ln\left(\exp\left(-\frac{|r-s'_j|^2}{2\sigma^2}\right) + \exp\left(-\frac{|r-s'_l|^2}{2\sigma^2}\right) + \exp\left(-\frac{|r-s'_h|^2}{2\sigma^2}\right)\right)$$

$$\approx \frac{-|r-s_j|^2 + |r-s'_j|^2}{4\sigma^2} + \frac{-|r-s_l|^2 + |r-s'_l|^2}{8\sigma^2} +$$

$$\frac{-|r-s_h|^2 + |r-s'_h|^2}{8\sigma^2}$$

As in the embodiment 2, the calculation of the LLR can be performed using Expression (18) obtained by introducing correction parameters u, v and C of the approximation deterioration into Expression (17). Incidentally, C in Expression (18) corresponds to a "correction term that may be zero sometimes.

$$L_k \approx (1-u-v)\left(\frac{-|r-s_j|^2 + |r-s'_j|^2}{2\sigma^2}\right) + \qquad (18)$$

$$u\left(\frac{-|r-s_l|^2 + |r-s'_l|^2}{2\sigma^2}\right) + v\left(\frac{-|r-s_h|^2 + |r-s'_h|^2}{2\sigma^2}\right) + C$$

Likewise, an LLR computation expression using four or more reference point pairs can be derived in a similar approximation technique. Although writing the approximate expression for all the four or more pairs is omitted, it can be derived by the technique in the foregoing description.

Next, the LLR computation device 100 of the embodiment 4 will be described. The LLR computation device 100 of the embodiment 4 calculates the LLR using Expression (17) and Expression (18), and its configuration is shown in FIG. 11.

Figure 11:
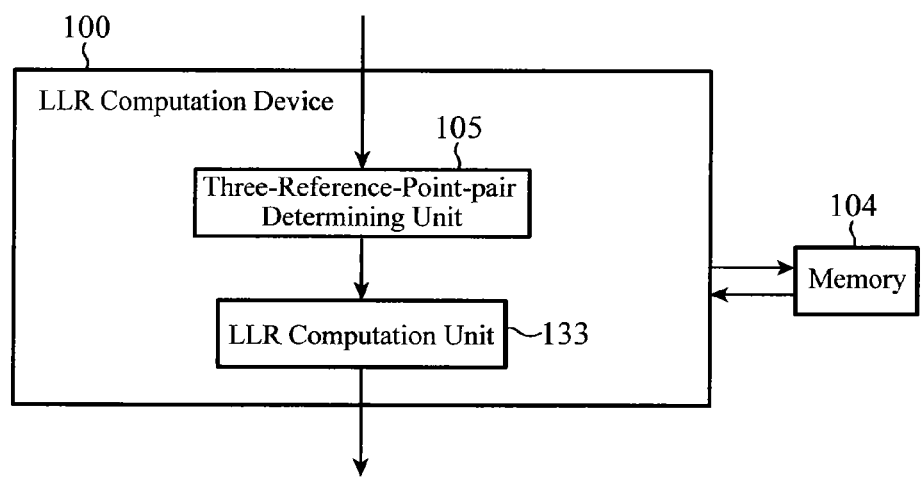
FIG. 11 is a block diagram showing a configuration of an LLR computation device of an embodiment 4 in accordance with the present invention.

The LLR computation device 100 of FIG. 11 comprises a three-reference-point-pair determining unit 105, an LLR computation unit 133, and the memory 104.

The three-reference-point-pair determining unit 105 decides three reference point pairs to be used for the LLR computation. The three reference point pairs decided here can be any three pairs. Their determining method corresponds to a combination of the examples of the determining methods of the reference point pairs described in the embodiments so far, which is applied to obtain the three pairs. The LLR computation unit 133 calculates the LLR using the three reference point pairs decided by the three-reference-point-pair determining unit 105 according to Expression (17) or Expression (18). However, Expression (17) and Expression (18) cannot be applied until the reference point pair closest to the received signal point among the three reference point pairs is decided. Incidentally, if such the reference point pair is known in advance, calculations for the decision are not necessary. In addition, the memory 104 stores the intermediate computation values and computation results of the individual portions as in the embodiments so far.

In this way, the embodiment 4 can approximate Expression (1) which is an ideal LLR computation expression by the approximate expression using three reference point pairs, and makes it possible to calculate the LLR at the approximation accuracy higher than the case of using one or two reference point pairs. Furthermore, the LLR calculated at higher approximation accuracy can improve the decoding performance of the soft-decision error correction decoder.

As described above, according to the LLR computation device of the embodiment 4, which is an LLR computation device of a receiver for receiving the signal that is generated by modulating an error-correcting-coded bit string by a multivalued modulation scheme and is transmitted to the receiver, it comprises the reference-point-pair determining unit that determines the three reference point pairs by selecting three transmission symbol points with their LLR computation target bit being 0 and three transmission symbol points with their LLR computation target bit being 1; and the LLR computation unit that assigns weights to and adds the three LLRs calculated for the individual three reference point pairs, and adds to the sum the correction term that can be zero sometimes, and makes the additional result the LLR for the three reference point pairs. Accordingly, it can further improve the approximation accuracy of the LLR calculated.

In addition, according to the LLR computation device of the embodiment 4, which is an LLR computation device of a receiver for receiving the signal that is generated by modulating an error-correcting-coded bit string by a multi-valued modulation scheme and is transmitted to the receiver, it comprises the reference-point-pair determining unit that determines a plurality of reference point pairs by selecting four or more transmission symbol points with their LLR computation target bit being 0 and four or more transmission symbol points with their LLR computation target bit being 1; and the LLR computation unit that assigns weights to and adds the plurality of LLRs calculated for the individual reference point pairs, and adds to the sum the correction term that can be zero sometimes, and makes the additional result the LLR. Accordingly, it can further improve the approximation accuracy of the LLR calculated.

Embodiment 5

Although the embodiment 3 determines the two reference points using the feedback from the soft-decision error correction decoder, the embodiment 5 relates to a configuration that determines three reference point pairs using the feedback and calculates the LLR.

Figure 12:
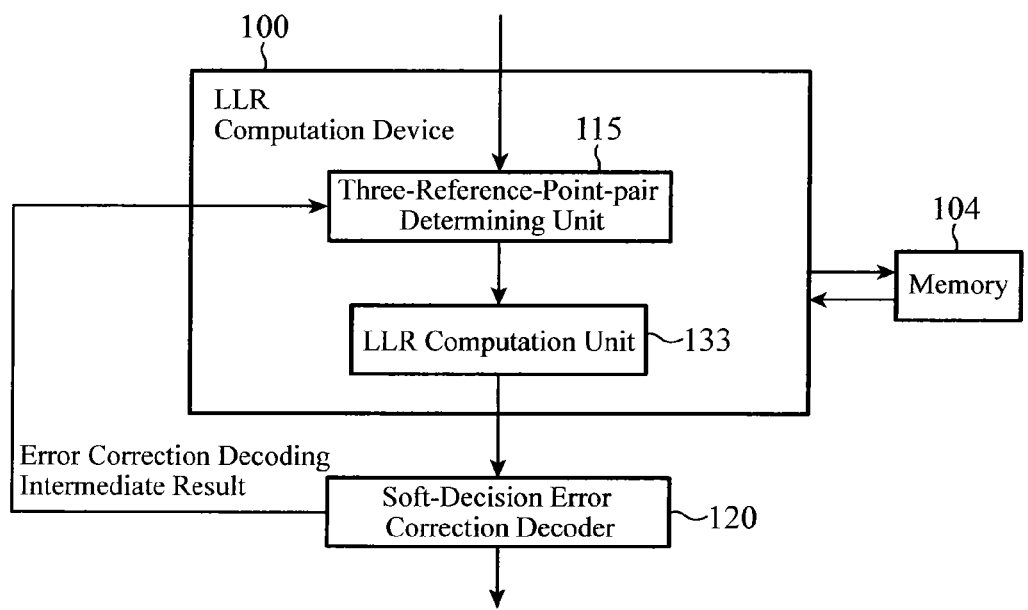
FIG. 12 is a block diagram showing a configuration of an LLR computation device of an embodiment 5 in accordance with the present invention.

FIG. 12 is a block diagram showing a configuration of the error correction decoding device of the embodiment 5. The error correction decoding device shown in FIG. 12 comprises the LLR computation device 100, the soft-decision error correction decoder 120, and the memory 104. The LLR computation device 100 includes a three-reference-point-pair determining unit 115 and an LLR computation unit 133. In addition, it is configured in such a manner as to feed the error correction decoding intermediate result back to the three-reference-point-pair determining unit 115 from the soft-decision error correction decoder 120.

The three-reference-point-pair determining unit 115 determines one to three reference point pairs from the intermediate decoding result fed back (determines three reference point pairs in total inclusive of a pair based on other than the feedback). For example, it determines three reference point pairs consisting of a reference point pair decided by the method of the Non-Patent Document 1, a reference point pair decided by the method of the Non-Patent Document 2 using the feedback, and a reference point pair decided by the method of the Non-Patent Document 2 using a first previous feedback in the repetition. In this case, the expression for calculating the kth bit LLR $L_k$ by the LLR computation unit 133 is given by the following Expression (19), where $L_{1,k}$ and $L_{2,k}$ are those mentioned in the BACKGROUND ART, and $L'_{2,k}$ equals $L_{2,k}$ in the previous repetition. The following Expression (19) corresponds to Expression (18) whose u and v are placed at u=v=¼.

$$L_k \approx \frac{-|r-s_j|^2 + |r-s'_j|^2}{4\sigma^2} + \frac{-|r-s_l|^2 + |r-s'_l|^2}{8\sigma^2} + \frac{-|r-s_h|^2 + |r-s'_h|^2}{8\sigma^2} + C$$

$$= \frac{1}{2}L_{1,k} + \frac{1}{4}L_{2,k} + \frac{1}{4}L'_{2,k} + C$$

More specifically, as shown in Expression (19), as to the three LLRs calculated for the reference point pairs, the LLR computation unit 133 multiplies the reference point pair closest to the received signal point among the three by ½, multiplies the other two LLRs by ¼, adds them, and further adds a correction term that may be zero sometimes to the additional result, thereby computing the LLR for the three reference point pairs. In Expression (19), C corresponds to the correction term that may be zero sometimes.

It goes without saying that three reference point pairs can be determined by other methods. For example, the three reference point pairs can be selected and determined from a neighborhood of a transmission symbol point corresponding to the intermediate decoding result.

The LLR computation unit 133 operates in the same manner as the LLR computation unit of the embodiment 4 (FIG. 11). However, Expression (17) and Expression (18) are inapplicable until the reference point which is closest to the received signal point among the three reference point pairs is decided. The decision is not necessary when such a reference point pair is known in advance. For example, when deciding the three reference point pairs in the operation of the three-reference-point-pair determining unit 115 as described before as an example, the decision is not necessary, and they can be calculated according to Expression (19). This is because the reference point pair selected by the determining method of the Non-Patent Document 1 is closest to the received signal point.

The present embodiment differs from the embodiment 4 in that it repeats the LLR calculations any number of times based on the feedback. In the process of the repetition, it can improve the approximation accuracy by altering u, w, C of the Expression (17) and Expression (18) and by using different values in accordance with the number of times of the repetition.

The soft-decision error correction decoder 120 performs the same operation as the soft-decision error correction decoder 120 of the embodiment 3. The memory 104 stores the intermediate computation values and computation results of the various portions as in the forgoing embodiments.

In this way, the embodiment 5 approximates Expression (1), the ideal LLR computation expression, by the approximate expression using the three reference point pairs, and can calculate the LLR at the approximation accuracy higher than when using one or two reference point pairs. Furthermore, the LLR calculated at higher approximation accuracy can improve the decoding performance of the soft-decision error correction decoder.

Furthermore, since the embodiment 5 can determine the reference points from the bit string with its error being corrected partly or entirely by the soft-decision error correction decoder 120, it can select and decide the more important reference points (reference points closer to the bit string transmitted by the transmitter) as compared with the case when deciding the reference point only from the received signal point. As a result, it can improve the approximation accuracy of the LLR calculated, and can reduce the bit error rate of the estimated bits which are the error correction decoding result finally output from the present configuration.

As described above, according to the error correction decoding device of the embodiment 5, the LLR computation unit is configured in such a manner that as to the three LLRs calculated for the reference point pairs, it multiplies the LLR for the reference point pair closest to the received signal point among the three by ½, and multiplies the other two LLRs by ¼, adds them, and adds the correction term that may be zero sometimes to the sum, and thus computes the addition result as the LLR for the three reference point pairs. Accordingly, it can further improve the approximation accuracy of the LLR calculated.

Incidentally, it is to be understood that a free combination of the individual embodiments, variations of any components of the individual embodiments or removal of any components of the individual embodiments are possible within the scope of the present invention.

INDUSTRIAL APPLICABILITY

An LLR computation device and an error correction decoding device in accordance with the present invention, which is an LLR computation device of a receiver for receiving the signal that is generated by modulating an error-correcting-coded bit string by a multivalued modulation scheme and is transmitted to the receiver, comprises the reference-point-pair determining unit that determines the two reference point pairs by selecting two transmission symbol points with their LLR computation target bit being 0 and two transmission symbol points with their LLR computation target bit being 1; and the LLR computation unit that assigns weights to and adds the two LLRs calculated for the two reference point pairs, respectively, and computes as the LLR for the two reference point pairs a value by further adding to the addition result the correction term that can be zero sometimes, wherein it determines the two reference point pairs by selecting two transmission symbol points with their LLR computation target bit being 0 and two transmission symbol points with their LLR computation target bit being 1, and assigns weights to and adds the two LLRs calculated for the two reference point pairs, respectively, and computes as the LLR for the two reference point pairs a value by further adding to the addition result the correction term that can be zero sometimes. Accordingly, it can improve the approximation accuracy of the LLR calculated. Thus, it is applicable to the LLR computation device and the error correction decoding device, which LLR computation device calculates the bit LLR representing the reliability of each transmission bit from the symbol coordinates of the received signal point the receiver of the communication system receives.

DESCRIPTION OF THE REFERENCE SYMBOLS 100, 200 LLR computation device; 101, 121 two-reference-point-pair determining unit; 102 square difference calculation unit of distances between the received signal point and the reference points (square difference calculation unit); 103, 113, 133 LLR computation unit; 104 memory; 105, 115 three-reference-point-pair determining unit; 110, 120 soft-decision error correction decoder; 210 LDPC decoder.

What is claimed is:

1. A Log-Likelihood Ratio (LLR) computation device of a receiver for receiving a signal that is generated by modulating an error-correcting-coded bit string by a multivalued modulation scheme and is transmitted to the receiver, the LLR computation device comprising:
a reference-point-pair determination circuitry that determines first/second reference point pairs by selecting two transmission symbol points each of whose k-th bit is 0 and two transmission symbol points each of whose k-th bit is 1, each of the first/second reference point pairs being consisted of a combination of the selected transmission symbol point whose k-th bit is 0 and the selected transmission symbol point whose k-th bit is 1; and
an LLR computation unit circuitry that calculates an LLR for a received signal point by
calculating a first LLR based on the first reference point pair and the received signal point and also calculating a second LLR based on the second reference point pair and the received signal point,
assigning weights to the first/second LLRs and adding up the weighted first/second LLRs, and
adding, to a result of the addition of the weighted first/second LLRs, a correction term.

2. The LLR computation device according to claim 1, wherein the LLR computation circuitry assigns equal weights to the first/second LLRs.

3. The LLR computation device according to claim 1, wherein the reference-point-pair determination circuitry determines all or part of the reference point pairs from a transmission symbol point closest in distance to the received signal point.

4. The LLR computation device according to claim 1, wherein the reference-point-pair determination circuitry determines as all or part of the reference points a transmission symbol which is known in advance to be transmitted frequently or always.

5. An error correction decoding device comprising:
the LLR computation device as defined in claim 1; and
a soft-decision error correction decoder that performs error correction decoding using the LLR computed by the LLR computation device,
wherein the LLR computation device determines at least part of the reference point pairs from an error correction decoding intermediate result of the soft-decision error correction decoder; and
the soft-decision error correction decoder outputs a final decoding result after repeating the error correction decoding a prescribed number of times.

6. The LLR computation device according to claim 1, wherein the correction term has a value of zero.

7. A Log-Likelihood Ratio (LLR) computation device of a receiver for receiving a signal that is generated by modulating an error-correcting-coded bit string by a multivalued modulation scheme and is transmitted to the receiver, the LLR computation device comprising:
a reference-point-pair determination circuitry that determines first/second reference point pairs by selecting two transmission symbol points each of whose k-th bit is 0 and two transmission symbol points each of whose k-th bit is 1, each of the first/second reference point pairs being consisted of a combination of the selected transmission symbol point whose k-th bit is 0 and the selected transmission symbol point whose k-th bit is 1;
a square difference calculation circuitry that calculates a difference between squared distances from a received signal point to each of the two transmission symbol points whose k-th bit is 0 and also calculate a difference between squared distances from the received signal point to each of the two transmission symbol points whose k-th bit is 1; and
an LLR computation circuitry that calculates an LLR for the received signal point by a prescribed LLR computation expression using the differences calculated by the square difference calculation circuitry.

8. The LLR computation device according to claim 7, wherein
the LLR computation circuitry performs LLR computation of a kth bit using the following expression, $$L_k = \ln \sum_{s_i \in C_{k,0}} \exp\left(-\frac{|r-s_i|^2}{2\sigma^2}\right) - \ln \sum_{s_i \in C_{k,1}} \exp\left(-\frac{|r-s_i|^2}{2\sigma^2}\right)$$

$$\approx \ln\left(\exp\left(-\frac{|r-s_j|^2}{2\sigma^2}\right) + \exp\left(-\frac{|r-s_l|^2}{2\sigma^2}\right)\right) -$$

$$\ln\left(\exp\left(-\frac{|r-s'_j|^2}{2\sigma^2}\right) + \exp\left(-\frac{|r-s'_l|^2}{2\sigma^2}\right)\right)$$

$$\approx \frac{-\min(|r-s_j|^2, |r-s_l|^2) + \min(|r-s'_j|^2, |r-s'_l|^2)}{2\sigma^2} +$$

$$\max\left(0, A - \frac{1}{4\sigma^2}||r-s_l|^2 - |r-s_j|^2|\right) -$$

$$\max\left(0, A - \frac{1}{4\sigma^2}||r-s'_l|^2 - |r-s'_j|^2|\right)$$

where r is the received signal point, $s_j$ and $s_1$ are reference points each of whose kth bit of the two transmission symbols being 0, $s'_j$ and $s'_1$ are reference points each of whose kth bit of the two transmission symbols being 1, σ is a standard deviation of Gaussian noise of a communication channel, and A is a constant term.

9. The LLR computation device according to claim 7, wherein the reference-point-pair determination circuitry determines all or part of the reference point pairs from a transmission symbol point closest in distance to the received signal point.

10. The LLR computation device according to claim 7, wherein the reference-point-pair determination circuitry determines as all or part of the reference points a transmission symbol which is known in advance to be transmitted frequently or always.

11. An error correction decoding device comprising:
the LLR computation device as defined in claim 7; and
a soft-decision error correction decoder that performs error correction decoding using the LLR computed by the LLR computation device,
wherein the LLR computation device determines at least part of the reference point pairs from an error correction decoding intermediate result of the soft-decision error correction decoder; and
the soft-decision error correction decoder outputs a final decoding result after repeating the error correction decoding a prescribed number of times.

12. A Log-Likelihood Ratio (LLR) computation device of a receiver for receiving a signal that is generated by modulating an error-correcting-coded bit string by a multivalued modulation scheme and is transmitted to the receiver, the LLR computation device comprising:
a reference-point-pair determination circuitry that determines first/second/third reference point pairs by selecting three transmission symbol points each of whose k-th bit is 0 and three transmission symbol points each of whose k-th bit is 1, each of the first/second/third reference point pairs being consisted of a combination of the selected transmission symbol point whose k-th bit is 0 and the selected transmission symbol point whose k-th bit is 1; and
an LLR computation circuitry that calculates an LLR for a received signal point by
calculating a first LLR based on the first reference point pair and the received signal point, calculating a second LLR based on the second reference point pair and the received signal point, and also calculating a third LLR based on the third reference point pair and the received signal point,
assigning weights to the first/second/third LLRs and adding up the weighted first/second/third LLRs, and
adding, to a result of the addition of the weighted first/second/third LLRs, a correction term.

13. The LLR computation device according to claim 12, wherein, when assigning the weights to the first/second/third LLRs, the LLR computation circuitry multiplies, by ½, one of the first/second/third LLRs which is calculated based on one of the first/second/third reference point pairs closest to the received signal point, and multiplies the other two LLRs by ¼.

14. The LLR computation device according to claim 12, wherein the reference-point-pair determination circuitry determines all or part of the reference point pairs from a transmission symbol point closest in distance to the received signal point.

15. The LLR computation device according to claim 12, wherein the reference-point-pair determination circuitry determines as all or part of the reference points a transmission symbol which is known in advance to be transmitted frequently or always.

16. An error correction decoding device comprising:
the LLR computation device as defined in claim 12; and
a soft-decision error correction decoder that performs error correction decoding using the LLR computed by the LLR computation device,
wherein the LLR computation device determines at least part of the reference point pairs from an error correction decoding intermediate result of the soft-decision error correction decoder; and
the soft-decision error correction decoder outputs a final decoding result after repeating the error correction decoding a prescribed number of times.

17. A Log-Likelihood Ratio (LLR) computation device of a receiver for receiving a signal that is generated by modulating an error-correcting-coded bit string by a multivalued modulation scheme and is transmitted to the receiver, the LLR computation device comprising:
a reference-point-pair determination circuitry that determines four or more reference point pairs by selecting four or more transmission symbol points each of whose k-th bit is 0 and four or more transmission symbol points each of whose k-th bit is 1, each of the reference point pairs being consisted of a combination of the selected transmission symbol point whose k-th bit is 0 and the selected transmission symbol point whose k-th bit is 1; and
an LLR computation circuitry that calculates an LLR for a received signal point by
calculating four or more LLRs based on the individual reference point pairs and the received signal point,
assigning weights to the four or more LLRs and adding up the weighted LLRs, and
adding, to a result of the addition of the weighted LLRs, a correction term.

18. The LLR computation device according to claim 17, wherein the reference-point-pair determination circuitry determines all or part of the reference point pairs from a transmission symbol point closest in distance to the received signal point.

19. The LLR computation device according to claim 17, wherein the reference-point-pair determination circuitry determines as all or part of the reference points a transmission symbol which is known in advance to be transmitted frequently or always.

20. An error correction decoding device comprising:
the LLR computation device as defined in claim 17; and
a soft-decision error correction decoder that performs error correction decoding using the LLR computed by the LLR computation device,
wherein the LLR computation device determines at least part of the reference point pairs from an error correction decoding intermediate result of the soft-decision error correction decoder; and
the soft-decision error correction decoder outputs a final decoding result after repeating the error correction decoding a prescribed number of times.

* * * * *

UNITED STATES PATENT AND TRADEMARK OFFICE
CERTIFICATE OF CORRECTION

PATENT NO. : 9,438,377 B2
APPLICATION NO. : 14/343305
DATED : September 6, 2016
INVENTOR(S) : Kenya Sugihara et al.

It is certified that error appears in the above-identified patent and that said Letters Patent is hereby corrected as shown below:

In the Claims

Column 21, Line 50, Claim 1, delete "unit" after "computation"

Signed and Sealed this
Thirteenth Day of March, 2018

Andrei Iancu
*Director of the United States Patent and Trademark Office*